United States Patent
Shin et al.

(10) Patent No.: US 12,080,595 B2
(45) Date of Patent: Sep. 3, 2024

(54) METHOD OF FORMING INTERCONNECT STRUCTURE

(71) Applicant: Samsung Electronics Co., Ltd., Suwon-si (KR)

(72) Inventors: Keunwook Shin, Yongin-si (KR); Sanghoon Ahn, Seongnam-si (KR); Woojin Lee, Hwaseong-si (KR); Kyung-Eun Byun, Seongnam-si (KR); Junghoo Shin, Seoul (KR); Hyeonjin Shin, Suwon-si (KR); Yunseong Lee, Osan-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 312 days.

(21) Appl. No.: 17/411,467

(22) Filed: Aug. 25, 2021

(65) Prior Publication Data

US 2022/0068704 A1  Mar. 3, 2022

(30) Foreign Application Priority Data

Aug. 31, 2020  (KR) .................. 10-2020-0110589

(51) Int. Cl.
*H01L 21/768* (2006.01)
*H01L 21/285* (2006.01)

(52) U.S. Cl.
CPC .... *H01L 21/7685* (2013.01); *H01L 21/76843* (2013.01); *H01L 21/76849* (2013.01); *H01L 21/76855* (2013.01); *H01L 21/28562* (2013.01)

(58) Field of Classification Search
None
See application file for complete search history.

(56) References Cited

U.S. PATENT DOCUMENTS

| 8,887,631 | B2 | 11/2014 | Nam et al. |
| 2012/0139114 | A1 | 6/2012 | Zhang et al. |
| 2016/0115032 | A1 | 4/2016 | Wodtke et al. |
| 2018/0233350 | A1 | 8/2018 | Tois et al. |
| 2018/0301335 | A1 | 10/2018 | Tapily et al. |
| 2020/0135557 | A1 | 4/2020 | Huang et al. |

FOREIGN PATENT DOCUMENTS

| EP | 2801551 A1 | 11/2014 |
| EP | 3264458 A1 | 1/2018 |
| EP | 3599638 A1 | 1/2020 |
| KR | 101300033 B1 | 8/2013 |
| WO | WO-2014/025615 A1 | 2/2014 |

OTHER PUBLICATIONS

Petro Deminskyi et al., 'Graphene as plasma-compatible blocking layer material for area-selective atomic layer deposition: A feasibility study for III-nitrides' *Journal of Vacuum Science & Technology A* 36(1), 2018, pp. 01A107-1-01A107-9.

Extended European Search Report dated Feb. 1, 2022, issued in corresponding European Patent Application No. 21193446.8.

*Primary Examiner* — Alexander G Ghyka
(74) *Attorney, Agent, or Firm* — HARNESS, DICKEY & PIERCE, P.L.C.

(57) ABSTRACT

Provided is a method of forming an interconnect structure. The method includes preparing a substrate including a first metal layer and a first insulating layer, selectively forming a carbon layer having an $sp^2$ bonding structure on the first metal layer, selectively forming a second insulating layer on the first insulating layer, forming a third insulating layer to cover the second insulating layer, and forming a second metal layer electrically connected to the first metal layer.

25 Claims, 15 Drawing Sheets

METHOD OF FORMING INTERCONNECT STRUCTURE

CROSS-REFERENCE TO RELATED APPLICATION

This application is based on and claims priority under 35 U.S.C. § 119 to Korean Patent Application No. 10-2020-0110589, filed on Aug. 31, 2020, in the Korean Intellectual Property Office, the disclosure of which is incorporated by reference herein in its entirety.

BACKGROUND

1. Field

The present disclosure relates to methods of forming an interconnect structure.

2. Description of Related Art

Sizes of semiconductor devices are being reduced for high integration of semiconductor devices, and accordingly, line widths of wirings in an interconnect structure have been reduced to a nano-scale.

In order to form nano-scale wiring, a photolithography process for nano-patterning may be performed, and in this case, misalignment, overlay, etc. may occur. Recently, in order to address the above issue, a fully-aligned via (FAV) integration process may be used.

SUMMARY

Provided are methods of forming an interconnect structure.

Additional aspects will be set forth in part in the description which follows and, in part, will be apparent from the description, or may be learned by practice of the presented embodiments of the disclosure.

According to an embodiment, a method of forming an interconnect structure may include preparing a substrate including a first metal layer and a first insulating layer; selectively forming a carbon layer on the first metal layer, the carbon layer having an $sp^2$ bonding structure; selectively forming a second insulating layer on the first insulating layer; forming a third insulating layer to cover the second insulating layer; and forming a second metal layer electrically connected to the first metal layer.

In some embodiments, the first metal layer may include at least one of Cu, Ru, Rh, Ir, Mo, W, Pd, Pt, Co, Ta, Ti, Ni, and Pd.

In some embodiments, the first insulating layer may include a dielectric material having a dielectric constant of about 3.6 or less.

In some embodiments, the carbon layer may be selectively formed on the first metal layer due to a reactivity difference between the first metal layer and the first insulating layer.

In some embodiments, the substrate may further include a barrier layer between the first metal layer and the first insulating layer. The selectively forming the carbon layer may include forming the carbon layer to cover the first metal layer or forming the carbon layer to cover the first metal layer and the barrier layer.

In some embodiments, the selectively forming the carbon layer may include depositing the carbon layer on the first metal layer through a deposition process using chemical vapor deposition (CVD) or plasma enhanced CVD (PECVD).

In some embodiments, a reaction gas used in the deposition process may include a carbon source, hydrogen ($H_2$) gas, and argon (Ar) gas. A volume ratio occupied by the hydrogen gas in the reaction gas may be about 0.1% or greater.

In some embodiments, the carbon layer may include intrinsic graphene or nanocrystalline graphene.

In some embodiments, the nanocrystalline graphene may include crystals having sizes of about 0.5 nm to about 100 nm.

In some embodiments, a ratio of carbon having the $sp^2$ bonding structure with respect to total carbon may be about 50% to about 99% in the nanocrystalline graphene.

In some embodiments, the carbon layer may have a contact angle of about 60° to about 110°.

In some embodiments, the method may further include performing a surface treatment on the carbon layer after the selectively forming the carbon layer. The surface treatment of the carbon layer may be performed by adding F, Cl, Br, N, P, or O atoms to the carbon layer.

In some embodiments, the selectively forming the second insulating layer may forming the second insulating layer on the first insulating layer due to a difference in surface energy between the first insulating layer and the carbon layer.

In some embodiments, the selectively forming the second insulating layer may include depositing the second insulating layer on the first insulating layer through a CVD process or an atomic layer deposition (ALD) process.

In some embodiments, the second insulating layer may include $Al_2O_3$, AlN, $ZrO_2$, $HfO_x$, $SiO_2$, SiCO, SiCN, SiON, SiCOH, AlSiO, or boron nitride (BN).

In some embodiments, at least a portion of the carbon layer may remain on the first metal layer after the forming the second metal layer.

In some embodiments, the method may further include partially removing or totally removing the carbon layer.

According to an embodiment, a method of forming an interconnect structure may include selectively forming a carbon layer on a substrate, the substrate including a first metal layer and a first insulating layer; selectively forming a second insulating layer on an upper surface of the first insulating layer and not an upper surface of the first metal layer; forming a third insulating layer on the substrate, the third insulating layer covering the second insulating layer; and forming a second metal layer on the third insulating layer. The carbon layer may cover the upper surface of the first metal layer and may not cover the upper surface of the first insulating layer. A portion of the second metal layer may extend through an opening in the third insulating layer and may be electrically connected to the first metal layer. The carbon layer may have an sp2 bonding structure.

In some embodiments, the first metal layer may include at least one of Cu, Ru, Rh, Ir, Mo, W, Pd, Pt, Co, Ta, Ti, Ni, and Pd.

In some embodiments, the carbon layer may include intrinsic graphene or nanocrystalline graphene.

In some embodiments, the substrate may further include a barrier layer between the first metal layer and the first insulating layer.

In some embodiments, the selectively forming the carbon layer may include depositing the carbon layer on the first metal layer through a deposition process using chemical vapor deposition (CVD) or plasma-enhanced CVD (PECVD). A reaction gas used in the deposition process may include a carbon source, hydrogen (H$_2$) gas, and argon (Ar) gas. The carbon layer may be selectively formed on the first metal layer due to a reactivity difference between the first metal layer and the first insulating layer.

BRIEF DESCRIPTION OF THE DRAWINGS

The above and other aspects, features, and effects of certain embodiments of the disclosure will be more apparent from the following description taken in conjunction with the accompanying drawings, in which.

DETAILED DESCRIPTION

Figure 1:
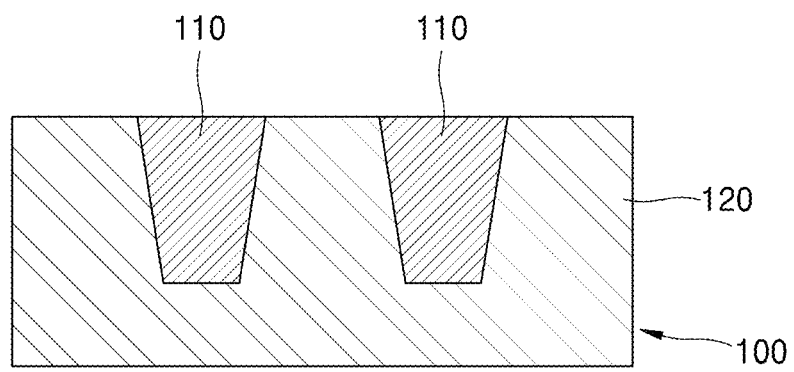
FIGS. 1, 3, 8-11, and 13-15 are diagrams for describing a method of manufacturing an interconnect structure, according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list. For example, "at least one of A, B, and C," "at least one of A, B, or C," "one of A, B, C, or a combination thereof," and "one of A, B, C, and a combination thereof," respectively, may be construed as covering any one of the following combinations: A; B; A and B; A and C; B and C; and A, B, and C."

Hereinafter, one or more embodiments of the present disclosure will be described in detail with reference to accompanying drawings. In the drawings, like reference numerals denote like components, and sizes of components in the drawings may be exaggerated for convenience of explanation. The embodiments of the disclosure are capable of various modifications and may be embodied in many different forms.

When a layer, a film, a region, or a panel is referred to as being "on" another element, it may be directly on/under/at left/right sides of the other layer or substrate, or intervening layers may also be present. An expression used in the singular encompasses the expression of the plural, unless it has a clearly different meaning in the context. It will be further understood that when a portion is referred to as "comprises" another component, the portion may not exclude another component but may further comprise another component unless the context states otherwise.

The use of the terms of "the above-described" and similar indicative terms may correspond to both the singular forms and the plural forms.

Also, the steps of all methods described herein may be performed in any suitable order unless otherwise indicated herein or otherwise clearly contradicted by context.

The use of any and all examples, or example language provided herein, is intended merely to better illuminate the present disclosure and does not pose a limitation on the scope of the present disclosure unless otherwise claimed.

When the terms "about" or "substantially" are used in this specification in connection with a numerical value, it is intended that the associated numerical value includes a manufacturing or operational tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

FIGS. 1, 3, 8-11, and 13-15 are diagrams for describing a method of manufacturing an interconnect structure, according to an embodiment. FIGS. 2, 6-7, 12, and 16-21 are diagrams for describing other examples of a method of manufacturing an interconnect structure, according to an embodiment. In example embodiments, an interconnect structure may be formed by using a fully-aligned via (FAV) integration process.

Referring to FIG. 1, a substrate 100 is prepared. The substrate 100 may include a first insulating layer 120 and at least one first metal layer 110. FIG. 1 shows an example in which two first metal layers 110 are formed in the first insulating layer 120 to be apart from each other.

The first insulating layer 120 is an inter-metal dielectric (IMD), and may generally include a low-k dielectric material. In an example, the first insulating layer 120 may have a dielectric material having a dielectric constant of about 3.6 or less. However, one or more embodiments are not limited thereto.

The first metal layers 110 formed in the first insulating layer 120 may include conductive wrings. The first metal layers 110 may each have a line width, for example, of a nano-scale (e.g., 100 nm or less, 50 nm or less, and/or 10 nm or less, but not limited thereto), but is not limited thereto. The first metal layer 110 may include, for example, at least one of Cu, Ru, Rh, Ir, Mo, W, Pd, Pt, Co, Ta, Ti, Ni, and Pd. However, one or more embodiments are not limited thereto.

Figure 2:
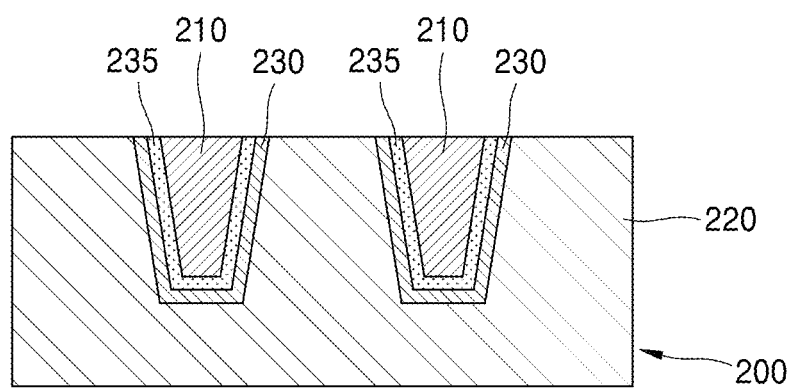
FIGS. 2, 6-7, 12, and 16-21 are diagrams for describing other examples of a method of manufacturing an interconnect structure, according to an embodiment.

FIG. 2 shows a substrate 200 according to another example. Referring to FIG. 2, at least one first metal layer 210 is arranged in a first insulating layer 220, and a barrier layer 230 is provided between the first metal layer 210 and the first insulating layer 220. The first insulating layer 220 and the first metal layer 210 are described above, and thus, descriptions thereof are omitted. In other words, the first insulating layer 220 may include any one of the same materials suitable for the first insulating layer 120 and the first metal layer 210 may include any one of the same materials suitable for the first metal layer 110.

The barrier layer 230 may limit and/or prevent a diffusion of a material included in the first metal layer 210. The barrier layer 230 may have a single-layered structure or a multi-layered structure in which a plurality of layers having different materials are stacked. The barrier layer 230 may include, for example, metal, a metal alloy, metal nitride, etc. For example, the barrier layer 230 may include, but is not limited to, Ta, Ti, Ru, RuTa, IrTa, W, TaN, TiN, RuN, IrTaN, TiSiN, Co, Mn, MnO, or WN. For example, the barrier layer 230 may include nanocrystalline graphene that will be described later.

A liner layer 235 may be further provided between the first metal layer 210 and the barrier layer 230 in order to improve adhesion between the first metal layer 210 and the barrier layer 230. The liner layer 235 may include TiN, TiW, WN, TaN, Ti, Ta, or a combination thereof, but is not limited thereto. The liner layer 235 may include a different material than the barrier layer 230.

Figure 3:
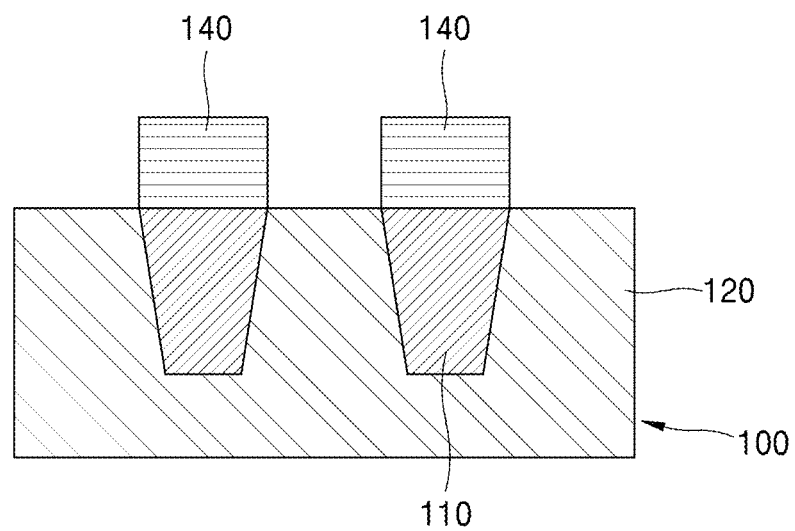

Referring to FIG. 3, carbon layers 140 are formed on the first metal layers 110 in the substrate 100 of FIG. 1. Here, the carbon layers 140 may each include carbon atoms having $sp^2$ bonding structure. The carbon layer 140 having the $sp^2$ bonding structure may include, for example, graphene. Graphene is a material in which carbon atoms are connected two-dimensionally to each other to form a hexagonal honeycomb structure. The graphene may include intrinsic graphene or nanocrystalline graphene.

The intrinsic graphene may be also referred to as crystalline graphene and may include crystals each having a size of about 100 nm or greater. In addition, nanocrystalline graphene may include crystals smaller than those of the intrinsic graphene, e.g., crystals each having a size of about 100 nm or less.

Hereinafter, the intrinsic graphene, the nanocrystalline graphene, and an amorphous carbon layer will be described in detail in comparison with one another.

Figure 4A:
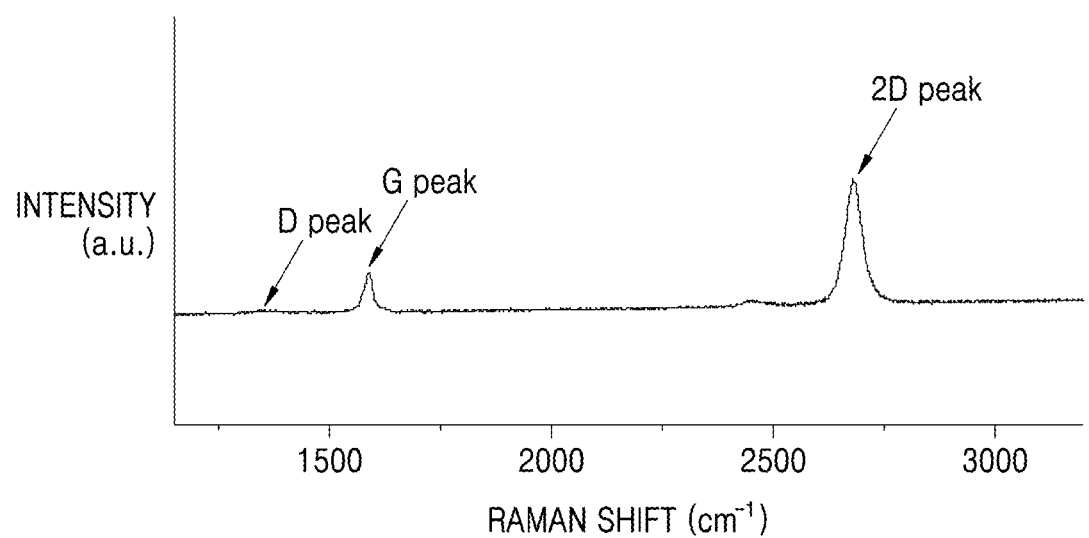
FIGS. 4A, 4B, and 4C are graphs showing examples of Raman spectra of the intrinsic graphene, the nanocrystalline graphene, and an amorphous carbon layer.
Figure 4B:
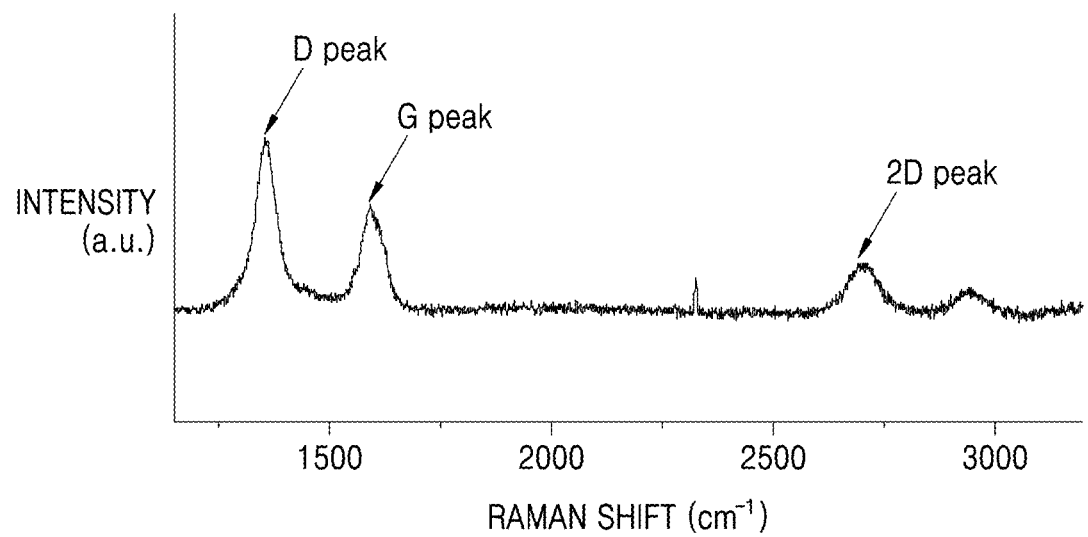
Figure 4C:
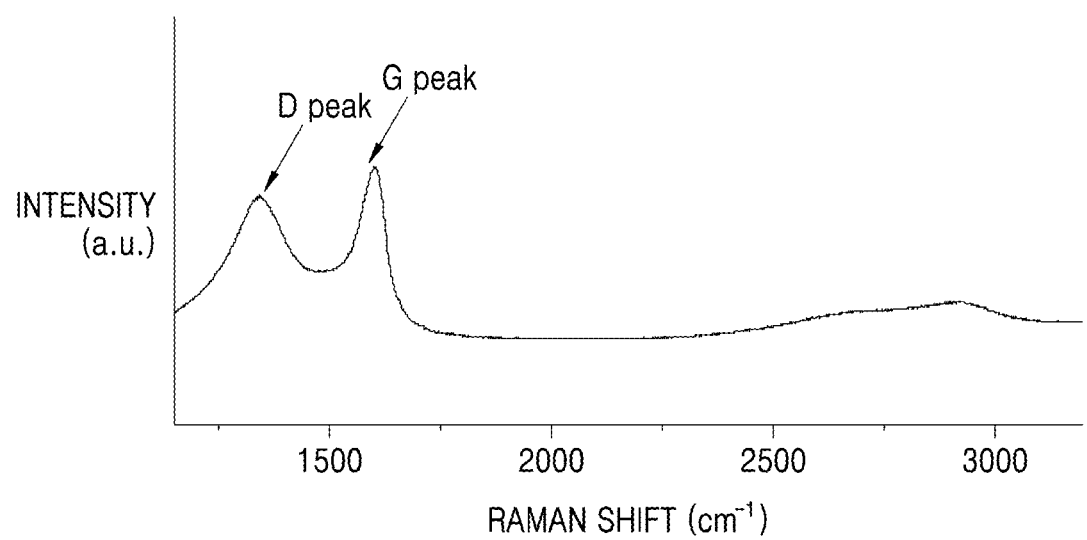

FIGS. 4A, 4B, and 4C are graphs showing examples of Raman spectra of the intrinsic graphene, the nanocrystalline graphene, and an amorphous carbon layer. A ratio of carbon having the $sp^2$ bonding structure with respect to total carbon, which will be described later, may be obtained through, for example, X-ray photoelectron spectroscopy (XPS) analysis, and content of hydrogen may be obtained through, for example, component analysis of Rutherford backscattering spectroscopy (RBS).

FIG. 4A shows an example of Raman spectrum indicating the intrinsic graphene.

Referring to FIG. 4A, in the intrinsic graphene, that is, the crystalline graphene, a ratio of D peak intensity with respect to G peak intensity is, for example, less than about 0.1, and a ratio of 2D peak intensity with respect to G peak intensity may be greater than, e.g., about 2. The intrinsic graphene may include crystals having sizes of about 100 nm or greater.

In the intrinsic graphene, a ratio of carbon having the $sp^2$ bonding structure with respect to the total carbon may be nearly about 100%. In addition, the intrinsic graphene may rarely include hydrogen. Also, a density of the intrinsic graphene may be, for example, about 2.1 g/cc, and a sheet resistance of the intrinsic graphene may be, for example, about 100 to 1000 Ohm/sq. However, one or more embodiments are not limited thereto.

FIG. 4B shows an example of Raman spectrum indicating the nanocrystalline graphene.

Referring to FIG. 4B, in the nanocrystalline graphene, a ratio of D peak intensity with respect to G peak intensity is, for example, less than about 2.1, and a ratio of 2D peak intensity with respect to G peak intensity may be greater than, e.g., about 0.1. In addition, a full width at half maximum (FWHM) of D peak may be, for example, about 25 to 120 $cm^{-1}$.

The nanocrystalline graphene may include crystals having smaller sizes than those of the intrinsic graphene, for example, sizes of about 0.5 nm to about 100 nm. In the nanocrystalline graphene, the ratio of carbon having $sp^2$ bonding structure with respect to the total carbon may be, for example, about 50% to about 99%. In addition, the nanocrystalline graphene may include, for example, hydrogen of about 1 at % to about 20 at %. Also, the density of the nanocrystalline graphene may be, for example, about 1.6 g/cc to about 2.1 g/cc, and a sheet resistance of the nanocrystalline graphene may be greater than, for example, about 1000 Ohm/sq.

FIG. 4C shows an example of Raman spectrum indicating the amorphous carbon layer.

Referring to FIG. 4C, in the amorphous carbon layer, an FWHM of D peak may be greater than, for example, about 120 $cm^{-1}$. In the amorphous carbon layer, a ratio of carbon having the $sp^2$ bonding structure with respect to the total carbon may be, for example, about 30% to about 50%. In addition, the amorphous silicon layer may include hydrogen, the content of which is greater than about 20 at %.

Referring back to FIG. 3, the carbon layer 140 having the $sp^2$ bonding structure may be selectively formed on the first metal layer 110 in the substrate 100. The carbon layer 140 having the $sp^2$ bonding structure may have a stabilized surface having low surface energy.

The carbon layer 140 having the $sp^2$ bonding structure may be formed by selectively growing the graphene on the first metal layer 110 through a chemical vapor deposition (CVD) process or a plasma enhanced CVD (PECVD) process. Here, the PECVD process may use, for example, capacitive coupled plasma (CCP), inductively coupled plasma (ICP), or microwave plasma.

When the carbon layer 140 having $sp^2$ bonding structure is formed through the CVD or the PECVD process, a reaction gas for growing graphene is injected into a reaction chamber (not shown) in which the substrate 100 including the first metal layer 110 and the first insulating layer 120 is provided.

The reaction gas may further include a hydrogen gas and an argon gas, in addition to a carbon source that supplies carbon for growing graphene. Here, a volume ratio occupied by the hydrogen gas in the reaction gas may be, for example, about 0.1% or greater. However, one or more embodiments are not limited thereto.

After injecting the reaction gas into the reaction chamber, when inside of the reaction chamber is maintained at a certain temperature and pressure, the graphene only grows from the first metal layer 110 due to a difference between reactivity of the first metal layer 110 and reactivity of the first insulating layer 120 with respect to the carbon atoms, and thus, the carbon layer 140 having the $sp^2$ bonding structure may be selectively formed. The carbon atoms decomposed from the carbon source have a higher reactivity with the first metal layer 110 than the first insulating layer 120. Therefore, the carbon atoms in the reaction chamber may be selectively adsorbed on the surface of the first metal layer 110, rather than the first insulating layer 120, and accordingly, the carbon layer 140 only grown from the first metal layer 110 and having the sp2 bonding structure may be selectively formed. For selectively forming the carbon layer 140 in FIG. 3 and carbon layers 241-242 in FIGS. 6-7, an example temperature range may be about 200° C. to about 450° C., and an example pressure range may be about 0.001 Torr to about 10 Torr.

Figure 5A:
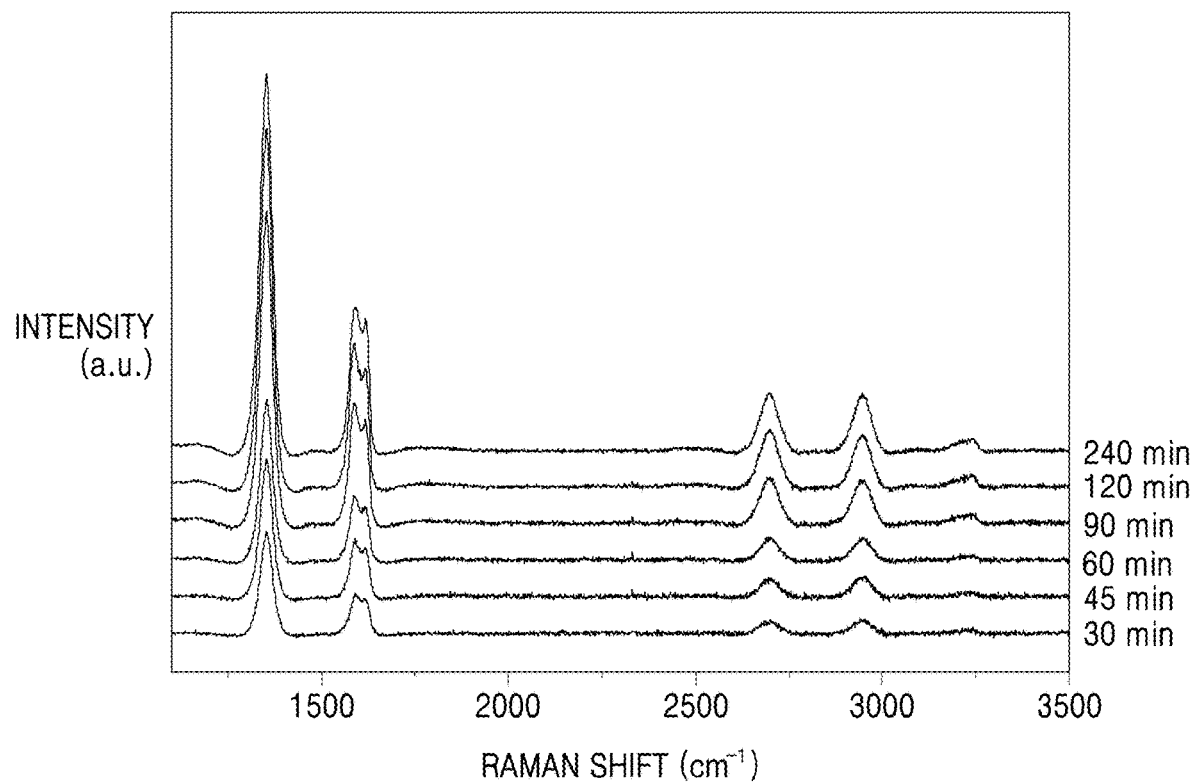
FIGS. 5A and 5B show examples of Raman spectra obtained by measuring a surface of the substrate after growing graphene for a certain processing time period on a substrate including Cu and an IMD material through a PECVD process.
Figure 5B:
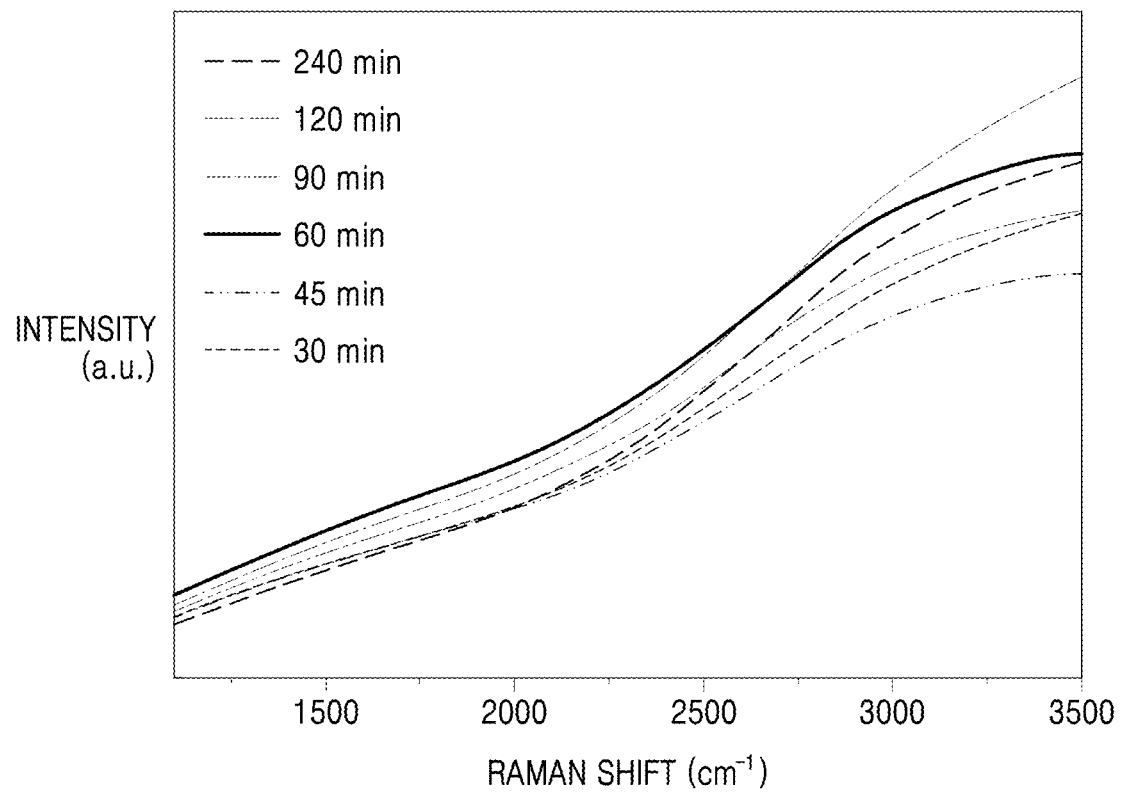

FIGS. 5A and 5B show examples of Raman spectra obtained by measuring a surface of the substrate after growing graphene for a certain processing time period on the substrate including Cu and an IMD material through a PECVD process.

FIG. 5A shows Raman spectra obtained by measuring a Cu surface of the substrate according to processing time. Referring to FIG. 5A, the nanocrystalline graphene is grown on the Cu surface of the substrate, and as the processing time increases, a growth amount of the nanocrystalline graphene is gradually increased.

FIG. 5B shows Raman spectra obtained by measuring a surface of the IMD material in the substrate according to processing time. Referring to FIG. 5B, the nanocrystalline graphene is not grown on the IMD material surface of the substrate regardless of the processing time.

As described above, when the graphene is grown on the surface of the substrate including Cu and the IMD material through the PECVD process, the nanocrystalline graphene is selectively grown only on the Cu surface.

Figure 6:
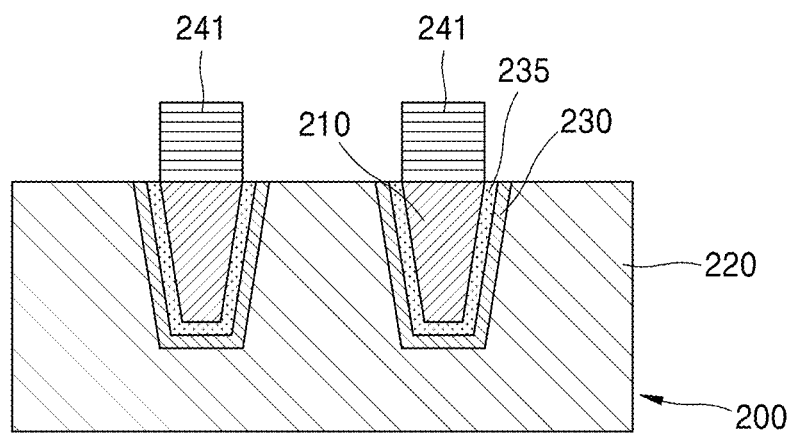
Figure 7:
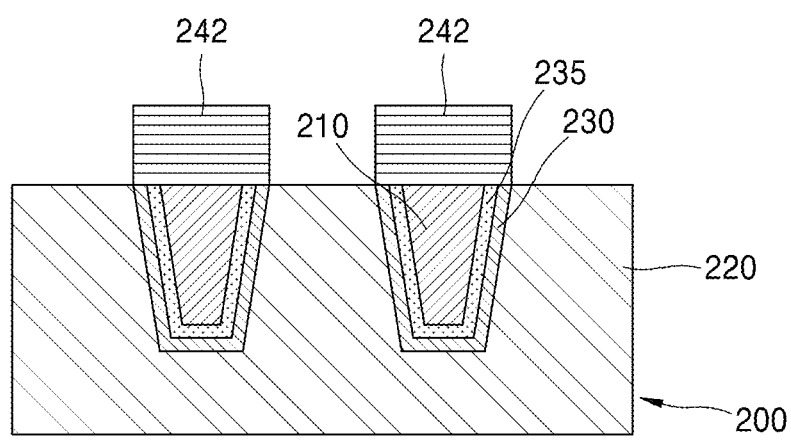

FIGS. 6 and 7 show other examples for cases in which carbon layers 241 and 242 having the $sp^2$ bonding structure are selectively formed on the substrate 200 of FIG. 2.

Referring to FIG. 6, the carbon layer 241 having the $sp^2$ bonding structure may be formed so as to only cover the first metal layer 210 in the substrate 200. In this case, the barrier layer 230 may include a material having a low reactivity with respect to the carbon atoms. Also, referring to FIG. 7, the carbon layer 242 having the $sp^2$ bonding structure may be formed to cover the first metal layer 210 and the barrier layer 230 in the substrate 200. In this case, the barrier layer 230 may include a material having a high reactivity with respect to the carbon atoms, like the first metal layer 210.

Figure 8:
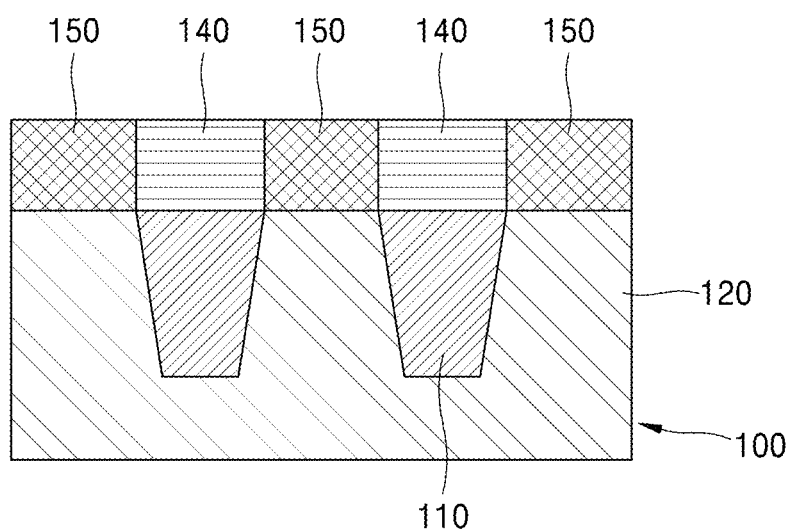

Referring to FIGS. 3 and 8, a second insulating layer 150 is selectively formed on the first insulating layer 120 between the carbon layers 140 having the $sp^2$ bonding structure. Here, the second insulating layer 150 may be deposited on the first insulating layer 120 through atomic layer deposition (ALD), CVD, PECVD, etc.

The carbon layer 140 having the $sp^2$ bonding structure may have a larger contact angle than that of the first insulating layer 120 or the first metal layer 110. For example, a surface of the carbon layer 140 having the $sp^2$ bonding structure may have a large contact angle of about 60° to about 110°. However, one or more embodiments are not limited thereto. Here, the contact angle denotes a water contact angle (WCA) of the surface, and will be the same hereinafter. The WCA denotes a contact angle with a droplet at an air-liquid-solid interface.

According to an experimental result of the contact angle, the contact angle of an IMD was measured as about 34.8° and contact angles of Cu and Ru were respectively measured as 36.7° and 29.2°. With regard to this, the contact angle of the nanocrystalline graphene was measured as about 90.6°.

When the carbon layer 140 having the $sp^2$ bonding structure has a larger contact angle than that of the first insulating layer 120, it may denote that the carbon layer 140 having the $sp^2$ bonding structure has a stabilized surface having lower surface energy than that of the first insulating layer 120. Therefore, in the deposition process of the second insulating layer 150, the carbon layer 140 having the $sp^2$ bonding structure may function as a mask, and accordingly, the second insulating layer 150 may be only deposited only on the first insulating layer 120 between the carbon layers 140 having the $sp^2$ bonding structure.

Also, the carbon layer 140 having the $sp^2$ bonding structure has a thermal stability at a high temperature of about 400° C. to about 500° C., and may stably function as a mask during an ALD or CVD process performed at high temperature.

The carbon layer 140 having the $sp^2$ bonding structure may additionally include atoms having large electronegativity in order to further reduce the surface energy. For example, the carbon layer 140 may additionally include F, Cl, Br, N, P, or O atoms. A concentration of the atoms added to the carbon layer 140 may be about 0.1 at % to about 10 at %, but is not limited thereto. In this case, the carbon layer 140 may have a larger contact angle than that of a case in which the above atoms are not added. For example, a contact angle of nanocrystalline graphene including F atoms was measured as about 102.1°.

The first insulating layer 120 may include, for example, a low-k dielectric material, but the second insulating layer 150 may include dielectric materials having various dielectric constants. For example, the second insulating layer 150 may include $Al_2O_3$, AlN, $ZrO_2$, $HfO_x$, $SiO_2$, SiCO, SiCN, SiON, SiCOH, AlSiO, or boron nitride (BN). However, one or more embodiments are not limited thereto.

Figure 9:
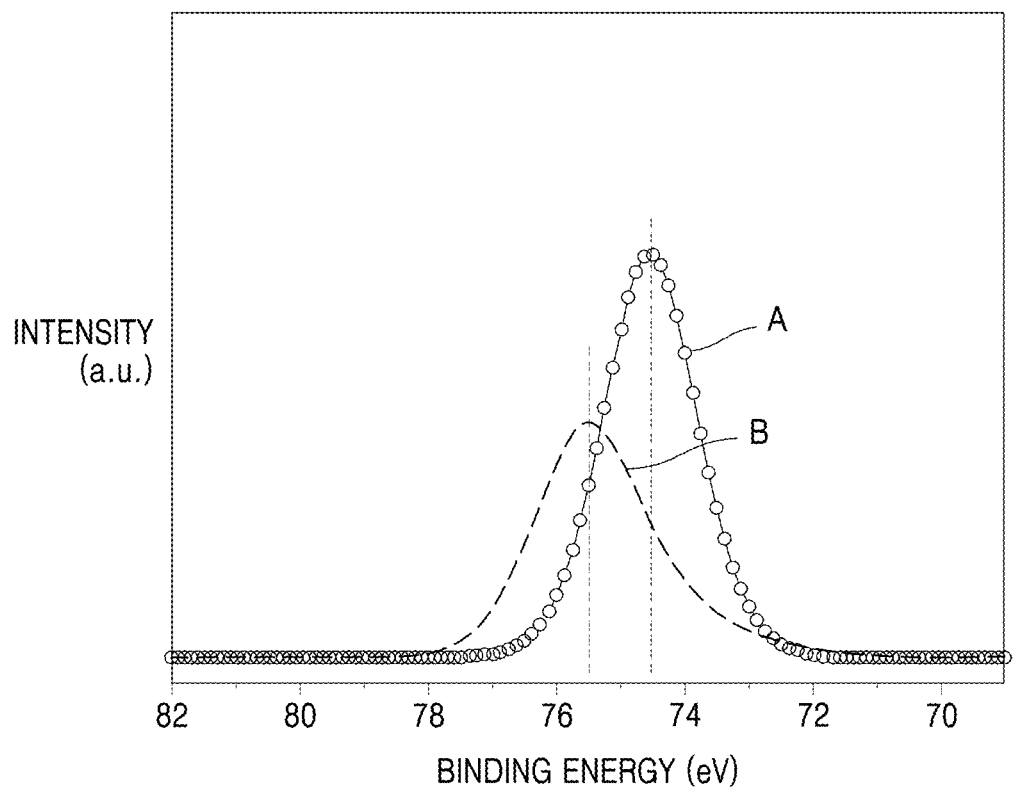

FIG. 9 shows, when an $Al_2O_3$ thin film is deposited on the substrate including the IMD and the nanocrystalline graphene through the ALD process, an example of a result of measuring an Al2p peak emitted from the substrate by using an XPS method.

In FIG. 9, "A" indicates Al2P peak emitted from the IMD, and "B" indicates the Al2p peak emitted from the nanocrystalline graphene. Referring to FIG. 9, a speed of depositing the $Al_2O_3$ thin film from the nanocrystalline graphene was measured about 22.2% of the speed of depositing the $Al_2O_3$ thin film from the IMD. As such, it may be recognized that the $Al_2O_3$ thin film may be selectively deposited on the IMD, not on the nanocrystalline graphene.

Figure 10:
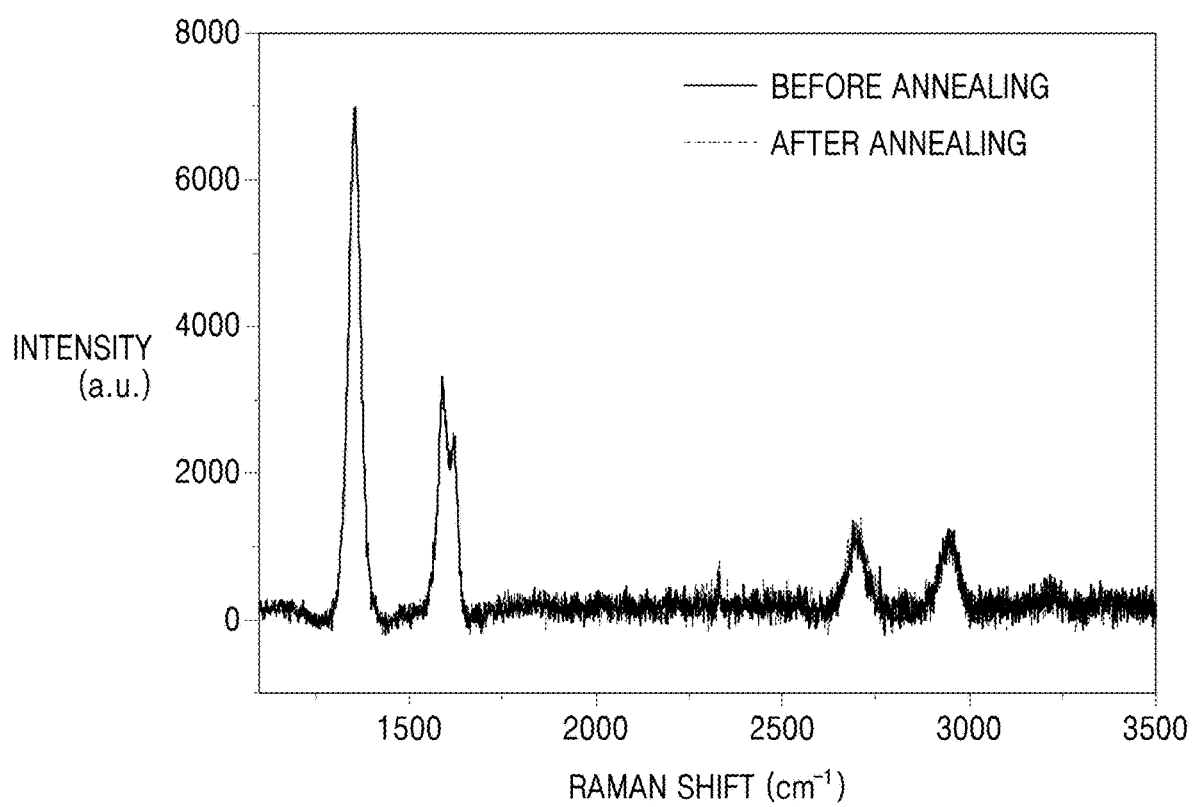

FIG. 10 shows an example of Raman spectrum of the nanocrystalline graphene measured before and after a heat treatment process performed during the ALD process, when the $Al_2O_3$ thin film is deposited on the substrate including the IMD and the nanocrystalline graphene through the ALD process.

Referring to FIG. 10, the Raman spectra before and after the heat treatment were nearly the same as each other. From the above experimental result, it may be recognized that the carbon layer 140 having the $sp^2$ bonding structure is rarely affected by the heat treatment performed during depositing the second insulating layer 150, and may stably function as the mask.

Figure 11:
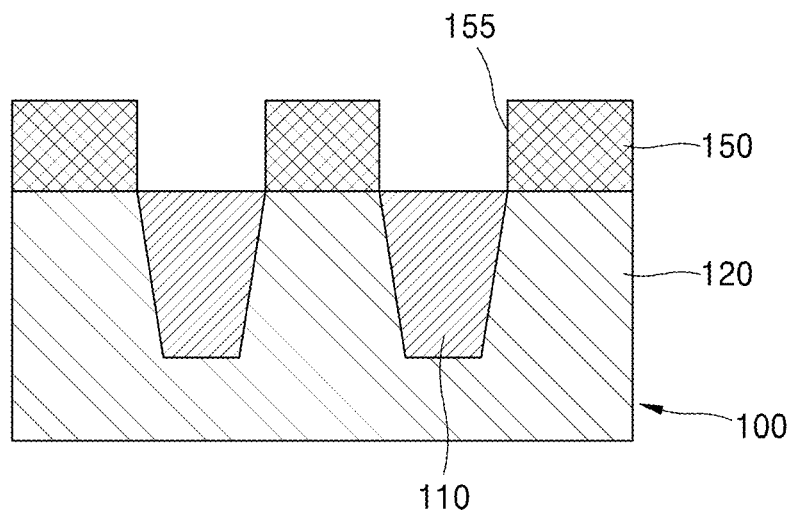

Referring to FIGS. 8 and 11, after depositing the second insulating layer 150 on the first insulating layer 120, the carbon layer 140 having the $sp^2$ bonding structure may be removed. Here, the carbon layer 140 may be removed by an etching or ashing process. For example, the carbon layer 140 may be removed by oxygen plasma ($O_2$ Plasma), hydrogen plasma ($H_2$ Plasma), etc.

When the carbon layer 140 having the $sp^2$ bonding structure is all removed, the first metal layer 110 of the substrate 100 may be exposed.

In FIG. 11, an example in which the carbon layer 140 having the $sp^2$ bonding structure on the first metal layer 110 is completely removed is described. However, the carbon layer 140 formed on the first metal layer 110 may not be removed, but remains on the first metal layer 110.

Figure 12:
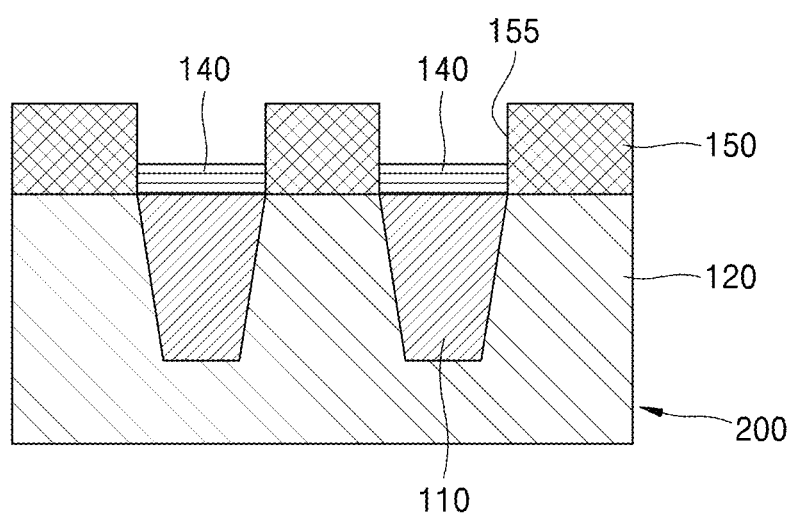

Alternatively, in another example as shown in FIG. 12, the carbon layer 140 having the $sp^2$ bonding structure formed on the first metal layer 110 may be partially removed. The carbon layer 140 having the $sp^2$ bonding structure remaining on the first metal layer 110 may act as a capping layer in the interconnect structure. The capping layer may reduce the electric resistance of the first metal layer, and accordingly, may increase electromigration resistance.

Recently, as sizes of semiconductor devices have been reduced for high integration of semiconductor devices, line widths of the conductive wirings also have been reduced. However, when the line width of the conductive wiring is reduced, a current density in the conductive wiring increases and an electric resistance of the conductive wiring also increases. The increase in the electric resistance causes electromigration effect, and thus, defects may occur in the conductive wiring and the conductive wiring may be damaged. Here, the electromigration refers to movement of a material caused by continuous movement of ions in a conductor, which is generated by a transfer of momentum between conductive electrons and atomic nuclei in the metal.

As described above, when the carbon layer 140 having the $sp^2$ bonding structure formed on the first metal layer 110 is not totally or partially removed but remains, the remaining carbon layer 140 may act as a capping layer that may improves the electromigration resistance.

Figure 13:
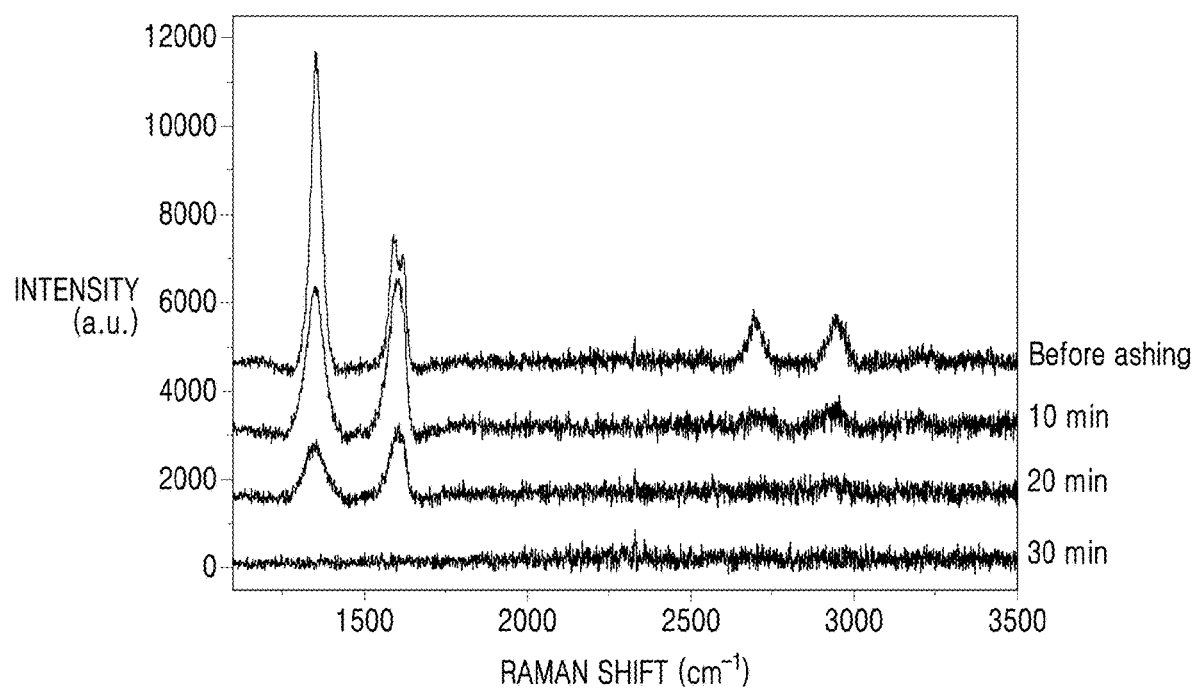

FIG. 13 shows an example of Raman spectrum showing a result of performing an ashing process by using hydrogen plasma on the nanocrystalline graphene formed on the substrate. FIG. 13 shows a state before performing the ashing process, and results of performing the ashing process for 10 minutes, 20 minutes, and 30 minutes.

Referring to FIG. 13, as the time of performing the hydrogen plasma process increases, the amount of the nanocrystalline graphene formed on the substrate is gradually reduced. Accordingly, the amount of nanocrystalline graphene remaining on the substrate may be adjusted by adjusting the time period of performing the hydrogen plasma process.

Figure 14:
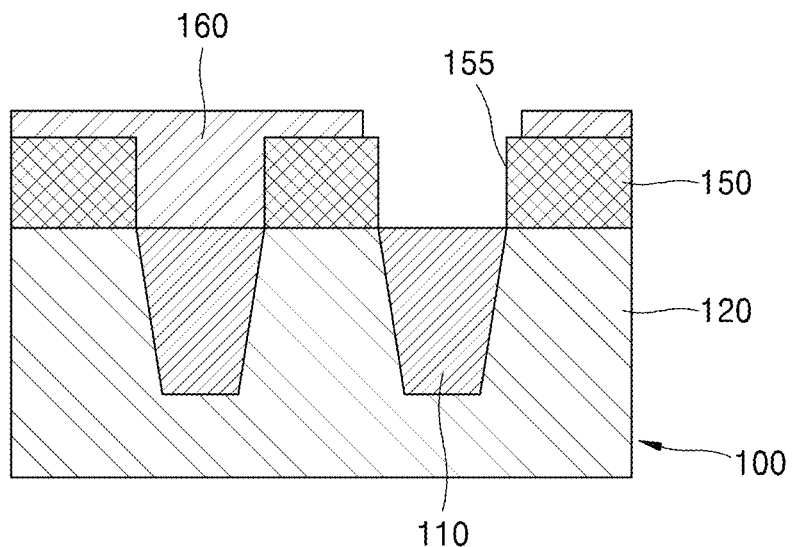

Referring to FIGS. 11 and 14, a third insulating layer 160 is formed to cover the second insulating layer 150 and then is patterned to form a via hole 155 that exposes the first metal layer 110, which is designed to be electrically connected, from among the first metal layers 110. Here, the third insulating layer 160 may be an IMD.

Figure 15:
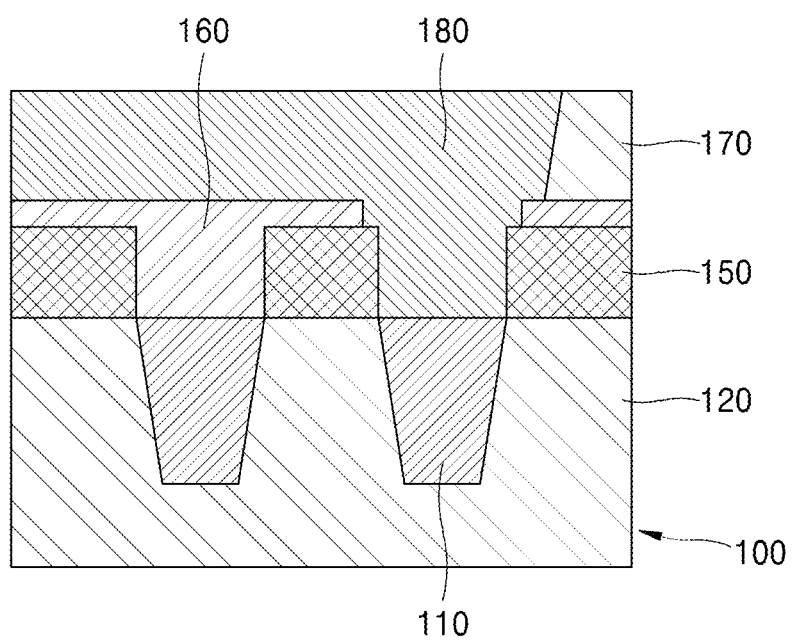

Referring to FIG. 15, a fourth insulating layer 170 is formed to fill the via hole 155 and then is patterned to form a second metal layer 180 that is electrically connected to the first metal layer 110. Here, the fourth insulating layer 170 may be an IMD.

When at least a part of the carbon layer 140 formed on the first metal layer 110 is not removed but remains, the carbon layer 140 may be between the first metal layer 110 and the second metal layer 180.

In the above description, an example in which the third insulating layer 160 is formed after removing the carbon layer 140 is described. However, the third insulating layer 160 may be formed to cover the carbon layer 140 and the second insulating layer 150 in a state in which the carbon layer 140 is not removed, and then, the third insulating layer 160 is patterned and the carbon layer 140 exposed through the via hole formed by patterning the third insulating layer 160 may be removed.

Figure 16:
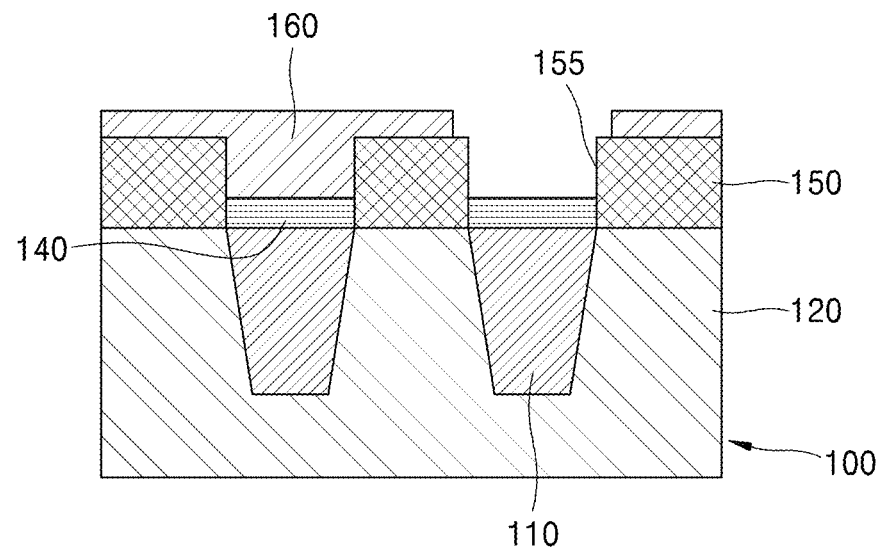
Figure 17:
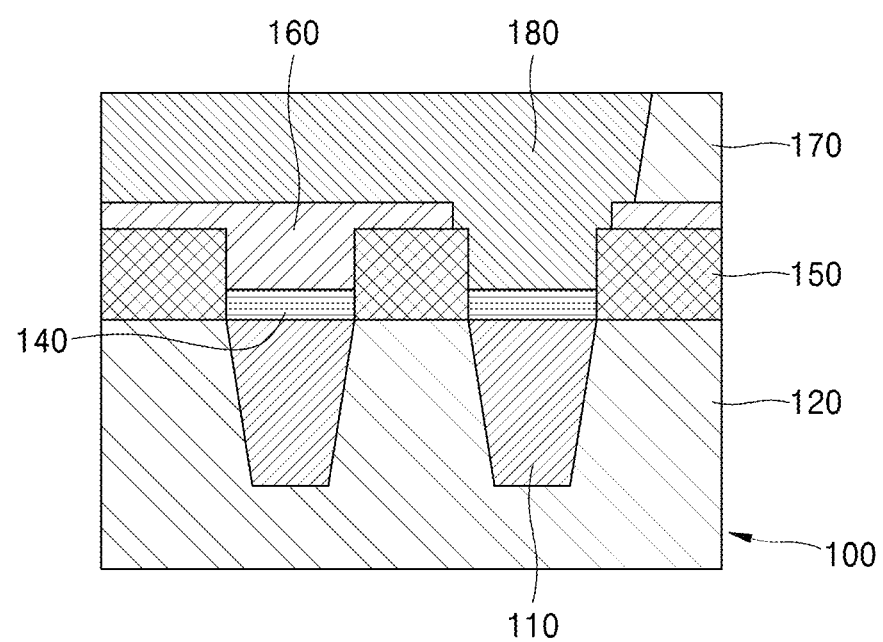

In another example, as depicted in FIGS. 12 and 16, the carbon layer 140 may be partially removed after the operation in FIG. 8, and then the third insulating layer 160 may be formed to cover the second insulating layer 150 and the remaining portion of the carbon layer 140. Then, the third insulating layer 160 may be patterned to form a via hole 155 that exposes part of the remaining portion of the carbon layer 140 through the via hole 155. Then referring to FIG. 17, a fourth insulating layer 170 may be formed and patterned on the third insulating layer 160. Then, the second metal layer 180 may be formed on the third insulating layer 160 and extend into the via hole 155 to cover the remaining portion of the carbon layer 140 in the via hole 155. A portion of the second metal layer 180 may extend into the via hole 155 and may be electrically connected to the first metal layer 110 under carbon layer 140 in the via hole.

As described above, in the formation of the interconnect structure by using the FAV integration process, the carbon layer 140 having the $sp^2$ bonding structure may be selectively formed only on the first metal layer 110 by using a reactivity difference in the substrate 100 including the first metal layer 110 and the first insulating layer 120.

In addition, because the carbon layer 140 having the $sp^2$ bonding structure has a stabilized surface having low surface energy, the carbon layer 140 having the $sp^2$ bonding structure may be used as a mask during the deposition process of the second insulating layer 150, and thus, the second insulating layer 150 may be selectively deposited on the first insulating layer 120 of the substrate 100.

As described above, according to one or more embodiments, when the interconnect structure is formed by using the FAV integration process, the carbon layer having the $sp^2$ bonding structure may be selectively formed on the first metal layer by using the reactivity difference in the substrate including the first metal layer and the first insulating layer. In addition, because the carbon layer having the $sp^2$ bonding structure has a stabilized surface having low surface energy, the carbon layer having the $sp^2$ bonding structure may be used as a mask during the deposition process of the second insulating layer, and thus, the second insulating layer may be selectively deposited on the first insulating layer of the substrate. Although the embodiments have been described above, these are merely examples, and various modifications may be made therefrom by those of ordinary skill in the art.

Figure 18:
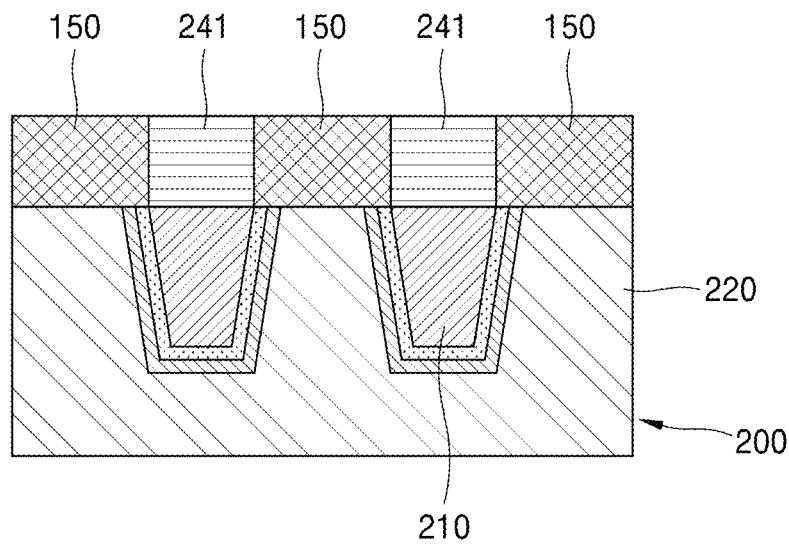
Figure 19:
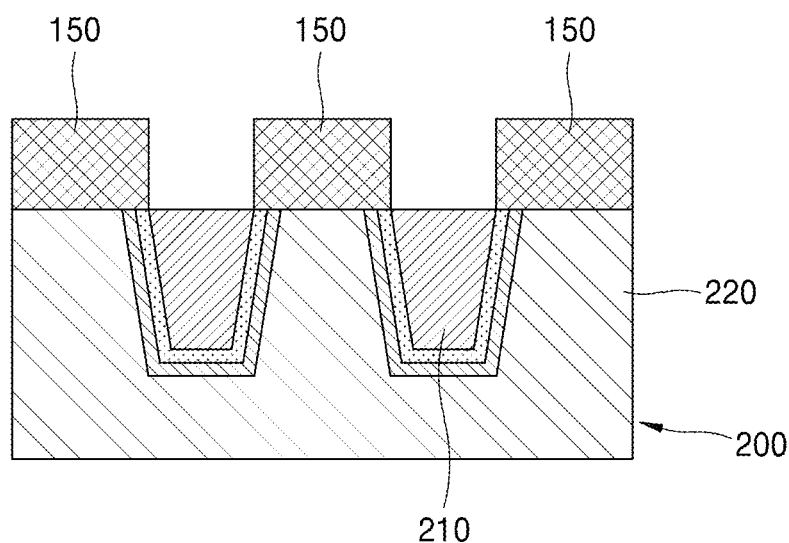
Figure 20:
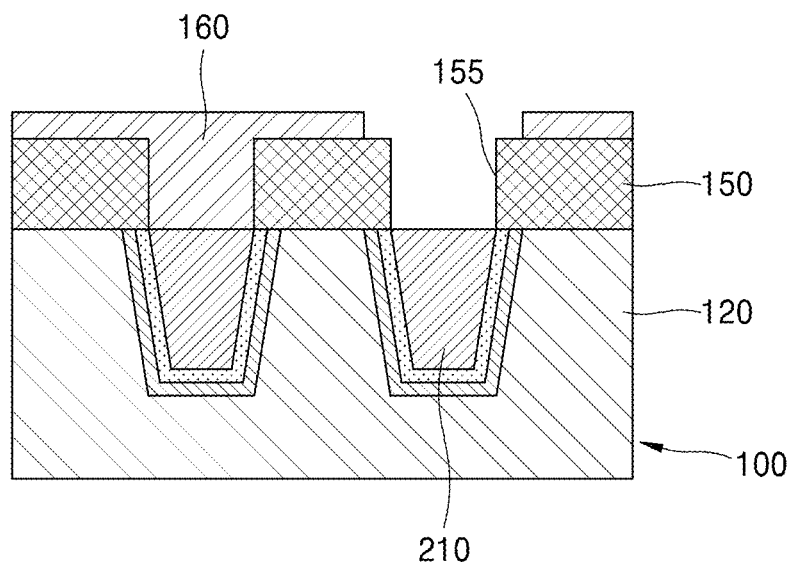
Figure 21:
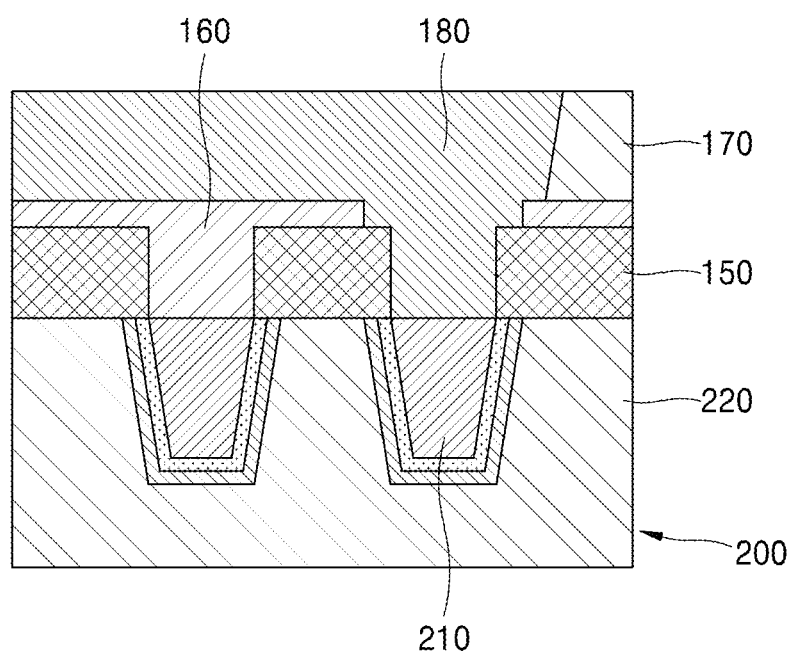

For example, referring to FIGS. 6 and 18, the second insulating layer 150 may be selectively deposited on the areas of the substrate 200 not covered by the carbon layer 241, such as the first insulating layer 220, the barrier layer 230, and the liner layer 235. As shown in FIG. 19, the carbon layer 241 next may be removed to expose the first metal layer 210. Then, as shown in FIG. 20, the third insulating layer 160 may be formed on the second insulating layer 150 and patterned to provide a via hole 155 that exposes the first metal layer 210. Then, as illustrated in FIG. 21, a fourth insulating layer 170 may be formed on the third insulating layer 160 and patterned. Then, the second metal layer 180 may be formed on the third insulating layer 160 and extend into the via hole 155 and may be electrically connected to the first metal layer 210 under in the via hole.

In another example, although the not illustrated, referring to FIG. 7, the second insulating layer 150 may be selectively deposited on the areas of the substrate 200 not covered by the carbon layer 242, such as the first insulating layer 220. Then, the carbon layer 242 may be removed to expose the first metal layer 210. Then, the operations described above in FIGS. 19 to 21 may be performed on the substrate 200 and layers thereon to provide an interconnect structure like the interconnect structure illustrated in FIG. 21, except where the second insulating layer 150 is selectively deposited only on the first insulating layer 220, in which case the third insulating layer 160 and the second metal layer 180 may be wider in portions extending through the second insulating layer 150.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope of inventive concepts as defined by the following claims.

What is claimed is:

1. A method of forming an interconnect structure, the method comprising:
preparing a substrate including a first metal layer and a first insulating layer;
selectively forming a carbon layer on the first metal layer, the carbon layer having an $sp^2$ bonding structure;
selectively forming a second insulating layer on the first insulating layer, the second insulating layer surrounding the carbon layer;
forming a third insulating layer after partially removing the carbon layer, the third insulating layer covering the second insulating layer, the third insulating layer including an opening over the first metal layer; and
forming a second metal layer on the third insulating layer and electrically connected to the first metal layer.

2. The method of claim 1, wherein the first metal layer comprises at least one of Cu, Ru, Rh, Ir, Mo, W, Pd, Pt, Co, Ta, Ti, Ni, and Pd.

3. The method of claim 1, wherein the first insulating layer includes a dielectric material having a dielectric constant of about 3.6 or less.

4. The method of claim 1, wherein the carbon layer is selectively formed on the first metal layer due to a reactivity difference between the first metal layer and the first insulating layer.

5. The method of claim 1, wherein the substrate further includes a barrier layer between the first metal layer and the first insulating layer.

6. The method of claim 5, wherein the selectively forming the carbon layer includes selectively forming the carbon layer to cover the first metal layer or selectively forming the carbon layer to cover the first metal layer and the barrier layer.

7. The method of claim 1, wherein the selectively forming the carbon layer includes depositing the carbon layer on the first metal layer through a deposition process using chemical vapor deposition (CVD) or plasma-enhanced CVD (PECVD).

8. The method of claim 7, wherein a reaction gas used in the deposition process includes a carbon source, hydrogen ($H_2$) gas, and argon (Ar) gas.

9. The method of claim 1, wherein the carbon layer includes intrinsic graphene or nanocrystalline graphene.

10. The method of claim 9, wherein the nanocrystalline graphene includes crystals having sizes of about 0.5 nm to about 100 nm.

11. The method of claim 9, wherein a ratio of carbon having an $sp^2$ bonding structure with respect to total carbon is about 50% to about 99% in the nanocrystalline graphene.

12. The method of claim 1, wherein the carbon layer has a contact angle of about 60° to about 110°.

13. The method of claim 1, further comprising:
performing a surface treatment on the carbon layer after the selectively forming of the carbon layer.

14. The method of claim 13, wherein the surface treatment of the carbon layer includes adding F, Cl, Br, N, P, or O atoms to the carbon layer.

15. The method of claim 1, wherein the selectively forming the second insulating layer includes forming the second insulating layer on the first insulating layer due to a difference in surface energy between the first insulating layer and the carbon layer.

16. The method of claim 1, wherein the selectively forming the second insulating layer includes depositing the second insulating layer on the first insulating layer through a chemical vapor deposition (CVD) process or an atomic layer deposition (ALD) process.

17. The method of claim 1, wherein the second insulating layer includes $Al_2O_3$, AlN, $ZrO_2$, $HfO_x$, $SiO_2$, SiCO, SiCN, SiON, SiCOH, AlSiO, or boron nitride (BN).

18. A method of forming an interconnect structure, the method comprising:
preparing a substrate including a first metal layer and a first insulating layer;
selectively forming a carbon layer on the first metal layer, the carbon layer having an $sp^2$ bonding structure;
selectively forming a second insulating layer on the first insulating layer, the second insulating layer surrounding the carbon layer;
forming a third insulating layer after partially removing the carbon layer, the third insulating layer covering the second insulating layer, the third insulating layer including an opening over the first metal layer; and
forming a second metal layer electrically connected to the first metal layer, wherein
at least a portion of the carbon layer remains on the first metal layer after the forming the second metal layer.

19. The method of claim 1, wherein
a first portion of the second metal layer extends over the third insulating layer,
a second portion of the second metal layer extends into the opening of the third insulating layer and electrically connects to the first metal layer, and
a thickness of the first portion of the second metal layer is less than a thickness of the second portion of the second metal layer.

20. A method of forming an interconnect structure, the method comprising:
selectively forming a carbon layer on a substrate, the substrate including a first metal layer and a first insulating layer, the carbon layer having an $sp^2$ bonding structure, the carbon layer covering an upper surface of the first metal layer and not covering an upper surface of the first insulating layer;
selectively forming a second insulating layer on the upper surface of the first insulating layer and not the upper surface of the first metal layer, the second insulating layer surrounding the carbon layer;
forming a third insulating layer on the substrate after partially removing the carbon layer, the third insulating layer covering the second insulating layer; and
forming a second metal layer on the third insulating layer, a portion of the second metal layer extending through an opening in the third insulating layer and being electrically connected to the first metal layer.

21. The method of claim 20, wherein the first metal layer comprises at least one of Cu, Ru, Rh, Ir, Mo, W, Pd, Pt, Co, Ta, Ti, Ni, and Pd.

22. The method of claim 20, wherein the carbon layer includes intrinsic graphene or nanocrystalline graphene.

23. The method of claim 20, wherein the substrate further includes a barrier layer between the first metal layer and the first insulating layer.

24. The method of claim 20, wherein
the selectively forming the carbon layer includes depositing the carbon layer on the first metal layer through a deposition process using chemical vapor deposition (CVD) or plasma-enhanced CVD (PECVD), a reaction gas used in the deposition process includes a carbon source, hydrogen ($H_2$) gas, and argon (Ar) gas, and the carbon layer is selectively formed on the first metal layer due to a reactivity difference between the first metal layer and the first insulating layer.

25. The method of claim 20, wherein at least a portion of the carbon layer remains on the first metal layer after the forming the second metal layer.

* * * * *